United States Patent
Lee et al.

(10) Patent No.: US 9,761,560 B2
(45) Date of Patent: Sep. 12, 2017

(54) DISPLAY DEVICE

(71) Applicant: SAMSUNG DISPLAY CO., LTD., Yongin, Gyeonggi-Do (KR)

(72) Inventors: Chung Seok Lee, Hwaseong-si (KR); Jeong Do Yang, Yongin-si (KR); Tae Ho Lee, Seoul (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/644,345

(22) Filed: Mar. 11, 2015

(65) Prior Publication Data

US 2016/0104692 A1 Apr. 14, 2016

(30) Foreign Application Priority Data

Oct. 13, 2014 (KR) ........................ 10-2014-0137500

(51) Int. Cl.
- *H01L 25/065* (2006.01)
- *H01L 27/32* (2006.01)
- *G02F 1/1345* (2006.01)
- *H01L 23/498* (2006.01)

(52) U.S. Cl.
CPC ...... *H01L 25/0655* (2013.01); *G02F 1/13452* (2013.01); *H01L 27/3276* (2013.01); *H01L 23/4985* (2013.01); *H01L 2924/0002* (2013.01)

(58) Field of Classification Search
CPC . H01L 27/3276; H01L 27/3223; H01L 23/02; H01L 27/108; H01L 25/065; H01L 25/0655; H01L 23/528; H05K 1/028; G02F 1/133514; G02F 1/1368
See application file for complete search history.

(56) References Cited

U.S. PATENT DOCUMENTS

| | | | |
|---|---|---|---|
| 7,745,726 B2* | 6/2010 | Lin | ........................ H05K 3/361 174/255 |
| 2002/0180686 A1 | 12/2002 | Yuda et al. | |
| 2007/0262425 A1* | 11/2007 | Seko | ...................... H01L 21/563 257/668 |
| 2009/0147204 A1* | 6/2009 | Kang | .................. G02F 1/13452 349/150 |
| 2010/0225624 A1 | 9/2010 | Fu et al. | |
| 2011/0139493 A1 | 6/2011 | Sumida et al. | |
| 2011/0175800 A1* | 7/2011 | Mizumaki | .............. G09G 3/006 345/87 |
| 2013/0114226 A1 | 5/2013 | Liao et al. | |

(Continued)

FOREIGN PATENT DOCUMENTS

| | | |
|---|---|---|
| JP | 2006-030630 A | 2/2006 |
| JP | 2011-128530 A | 6/2011 |
| KR | 10-2011-0030685 A | 3/2011 |

*Primary Examiner* — Daniel Luke
*Assistant Examiner* — Khatib Rahman
(74) *Attorney, Agent, or Firm* — Lee & Morse, P.C.

(57) ABSTRACT

A display device includes a panel substrate including a pad region, and a COF (Chip On Film) including a wire region, the wire region including a plurality of wires connected to the pad region of the panel substrate, wherein the plurality of wires in the wire region is arranged into a plurality of sections, intervals between wires within each section being different from intervals between wires within an adjacent section, and at least one of the plurality of sections including a plurality of wires at a fixed interval.

12 Claims, 5 Drawing Sheets

(56) References Cited

U.S. PATENT DOCUMENTS

2014/0054793 A1 2/2014 Ha et al.
2014/0183567 A1* 7/2014 Han .................... H01L 27/1296
 257/88

* cited by examiner

DISPLAY DEVICE

CROSS-REFERENCE TO RELATED APPLICATION

Korean Patent Application No. 10-2014-0137500, filed on Oct. 13, 2014, in the Korean Intellectual Property Office, and entitled: "Display Device," is incorporated by reference herein in its entirety.

BACKGROUND

1. Field

Embodiments relate to a display device, and more particularly, to a display device on which a COF (Chip On Film) type driving IC (Integrated Circuit) is mounted.

2. Description of the Related Art

Recently, with the development of information society, there has been an increasing demand for flat panel display devices which are light, thin, short, and small. Such flat panel display devices may include, e.g., a liquid crystal display (LCD), an electrophoretic display, an organic light emitting diode (OLED) display, an inorganic electroluminescent (EL) display, a field emission display, a surface-conduction electron-emitter display, a plasma display, etc. Further, among such flat panel display devices, a demand for a flexible display device, which can be bent or folded when a user desires to do so, or which is manufactured through bending or folding processes, has been extended.

Such a flexible display device includes a display region, on which a plurality of pixels are arranged to display an image, and a non-display region, on which a plurality of pads are arranged and no image is displayed. Further, a driver IC, in which a driving circuit for driving the pixels arranged on the display region is integrated, is arranged on the non-display region. For example, the driver IC may be mounted in the form of a TCP or COF, which can be bent toward a rear surface of the display region to arrange the driver IC with a compact structure.

SUMMARY

According to an embodiment, a display device includes a panel substrate including a pad region, and a COF (Chip On Film) including a wire region, the wire region including a plurality of wires connected to the pad region of the panel substrate, wherein the plurality of wires in the wire region is arranged into a plurality of sections, intervals between wires within each section being different from intervals between wires within an adjacent section, and at least one of the plurality of sections including a plurality of wires at a fixed interval.

The wire region may include at least one first section with wires at a fixed interval, and a plurality of second sections with wires at intervals having different values.

The first section may be closer to a center region of the COF than the second sections.

The interval between the wires of the first section may be narrower than the interval between the wires of the second sections.

The interval between the wires in the second sections gradually may increase as a distance from a respective edge region decreases.

The first section and the second sections may be alternately arranged in the wire region.

The wires in the first section may be perpendicular to an edge of the COF.

The wires in the second sections may be at an oblique angle with respect to the edge of the COF.

Line widths of the wires in the second sections may gradually increase, as a distance of the wires from a center region of the COF increases.

The wire region may include a first section in a center region of the COF, at least one second section at a first side of the first section, at least one third section at a second side of the first section, at least one fourth section adjacent to the second section, the second section being between the first and fourth sections, and at least one fifth section adjacent to the third section, the third section being between the first and fifth sections.

Intervals of the wires within each of the first to fifth sections may be fixed.

The display device may further include dummy wires in the second section and in the third section.

The interval of the wires in the first section may be narrower than the interval of the wires in the fourth or fifth section.

According to another embodiment, a display device includes a panel substrate including a pad region, and a COF (Chip On Film) including a wire region, the wire region including a plurality of wires connected to the pad region of the panel substrate, wherein the plurality of wires in the wire region is arranged into a plurality of sections, line widths within each section being different from line widths within an adjacent section, and at least one of the plurality of sections including a plurality of wires with a fixed line width.

The wire region may include at least one first section with wires having a same line width, and a plurality of second sections with wires having different line widths.

The first section may be closer to a center region of the COF than the second sections.

The line width of the wires in the first section may be narrower than the line width of the wires in the second sections.

Line widths of the wires in the second sections may gradually increase, as a distance of the wires from the center region of the COF increases.

The wires in the first section may be perpendicular to an edge of the COF.

The wires in the second sections may be at an oblique angle with respect to the edge of the COF.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Although the terms "first", "second", and so forth are used to describe diverse constituent elements, such constituent elements are not limited by these terms. These terms are used only to discriminate a constituent element from other constituent elements. Accordingly, in the following description, a first constituent element may be a second constituent element. Further, the use of "may" when describing embodiments relates to "one or more embodiments."

Hereinafter, embodiments will be described with reference to the drawings.

Figure 1:
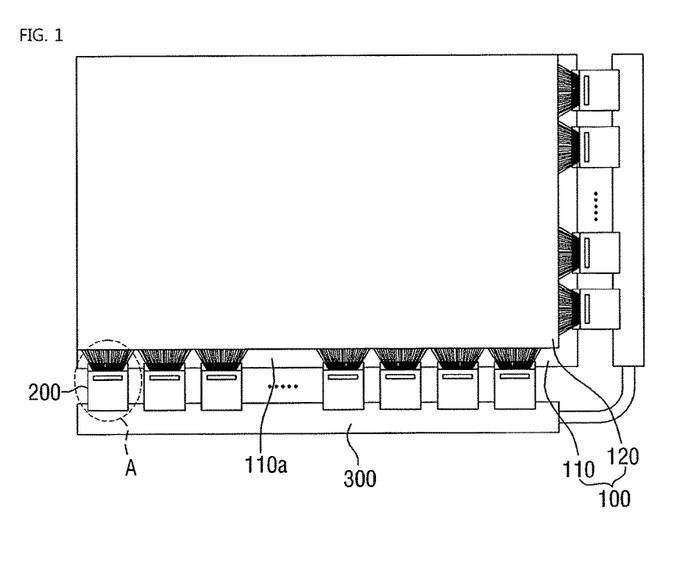
FIG. 1 illustrates a schematic plan view of a display device according to an embodiment.
Figure 2:
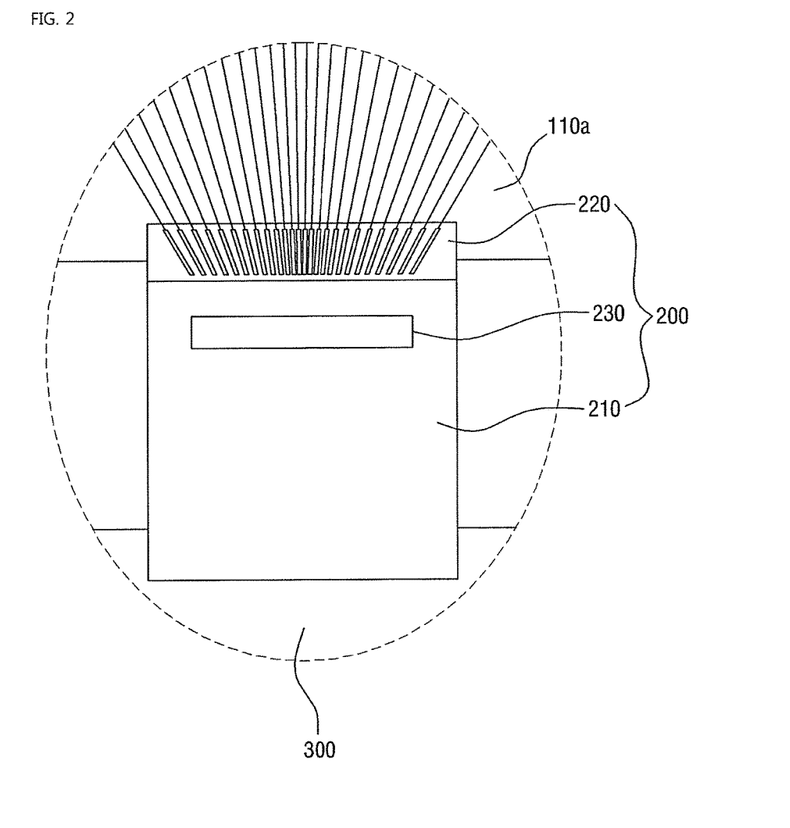
FIG. 2 illustrates an enlarged view of portion A of FIG. 1.

FIG. 1 is a schematic plan view of a display device according to an embodiment, and FIG. 2 is an enlarged view of portion A of FIG. 1.

Referring to FIG. 1, a display device according to an embodiment may include a panel substrate 100, a COF (Chip On Film) 200, and a printed circuit board (PCB) 300. The panel substrate 100 may include a first substrate 110, a second substrate 120, and a display region with pixels between the first substrate 110 and the second substrate 120.

The display region of the panel substrate 100 may include a plurality of pixels that display an image. The plurality of pixels are arranged in a matrix form at intersection points of a plurality of scan lines and data lines, to which data and control signals are respectively applied from the printed circuit board 300. The pixels may include switching elements that are turned on/off according to the control signal applied from the printed circuit board 300, e.g., light emitting elements that emit light under the control of thin film transistors and the switching elements.

The first substrate 110 of the panel substrate 100 may have a wider area than an area of the second substrate 120. A non-display region, where an image is not displayed, may exist on the first substrate 110 having the wider area. Such a non-display region may include a pad region 110a with a plurality of scan and data pads, which are respectively connected to the plurality of scan lines and data lines for applying signals to the pixels to display an image. The pad region 110a of the panel substrate 100 may contact a plurality of output wires formed on one side of the COF 200.

The COF 200 may be provided between the panel substrate 100 and the printed circuit board 300. The COF 200 serves to receive RGB data and control signals that are input from the printed circuit board 300, and to transfer the received RGB data and control signals to the panel substrate 100 on which an image is displayed.

Referring to FIG. 2, the COF 200 may include a flexible insulating film 210, e.g., made of a polyimide (PI) material, an output wire region 220 formed on a region that is connected to the panel substrate 100 on the flexible insulating film 210, an input wire region (not illustrated) formed on a region that is connected to the printed circuit board 300 on the flexible insulating film 210, and a driver IC 230 mounted on an open region of the flexible insulating film 210 that is formed between the output wire region 220 and the input wire region (not illustrated). The output wire region 220 of the COF 200 may be divided into a plurality of sections. The plurality of output wires formed on the respective sections of the output wire region 220 may be arranged with the same formation width but at different intervals between the output wires. The details of the output wire region 220 of the COF 200 will be described in more detail below with reference to FIGS. 3-4.

The printed circuit board 300 may be electrically connected to the panel substrate 100 through the COF 200. The printed circuit board 300 may receive a RGB data signal from an outside to transfer the received RGB data signal to the COF 200, and may generate and apply control signals for controlling the operation of the panel substrate 100.

Figure 3:
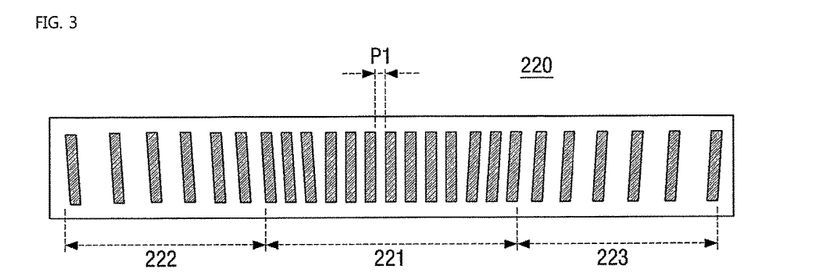
FIG. 3 illustrates an enlarged plan view of an output wire region of a COF according to an embodiment.
Figure 4:
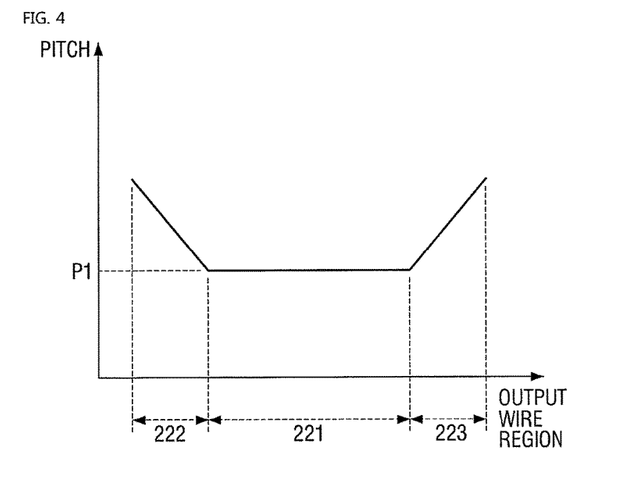
FIG. 4 illustrates a graph of the characteristic of a pitch between output wires of a COF according to an embodiment.

FIG. 3 is an enlarged plan view of the output wire region 220 of the COF 200 according to an embodiment. FIG. 4 is a graph illustrating the characteristic of a pitch between output wires of the COF 200 according to an embodiment.

Referring to FIG. 3, as discussed previously, the output wire region 220 of the COF 200 according to an embodiment may be divided into a plurality of sections. For example, the output wire region 220 may be divided into a first section 221, a second section 222 arranged on a first side of the first section 221, and a third section 223 arranged on a second side of the first section 221.

The first section 221 may correspond to a center region in the output wire region 220 of the COF 200. The first section 221 may include a plurality of output wires having a first fixed pitch P1, as illustrated in FIG. 4. For example, the first fixed pitch P1, i.e., interval, between all the output wires that are formed in the first section 221 may be 26 μm. For example, the plurality of output wires that are formed in the first section 221 may not be angled with respect to an edge of the output wire region 220, i.e., the output wires may be arranged in the form of straight lines substantially perpendicular to the edge.

The second section 222 may be arranged on the first side of the first section 221, and may correspond to a left edge region of the output wire region 220 of the COF 200 (as viewed in FIG. 3). The third section 223 may be arranged on the second side of the first section 221, and may correspond to a right edge region of the output wire region 220 of the COF 200 (as viewed in FIG. 3).

A plurality of output wires may be arranged in each of the second section 222 and the third section 223. As illustrated in FIG. 4, different intervals may be set between the respective output wires that are arranged in the second section 222 and the third section 223. In detail, the pitch, i.e., interval, between the output wires in each of the second section 222 and the third section 223 may be arranged to gradually increase as a distance from a respective edge region decreases. For example, if the output wires of the first section 221 have a constant interval of about 26.0 μm, an interval between a wire of an outermost edge of the first section 221 and a corresponding closest first wire of each of the second section 222 and the third section 223 may have a pitch, i.e., interval, of about 26.2 µm, and an interval between the first wire and the second wire in each of the second section 222 and the third section 223 may have a pitch of about 26.4 µm. Here, the first wire of the first and second wires of the second section 222 and the third section 223 may be arranged at a distance that is close to the first section 221.

Further, the plurality of output wires that are arranged in the second section 222 and the third section 223 may have an angle. In other words, as illustrated in FIG. 3, the output wires in the second and third sections 222 and 223 are positioned at an angle with respect to the edge of the output wire region 220. If the output wires are formed to have an angle as described above, alignment with the pad region formed on the panel substrate 100 may be facilitated. In other words, misalignment between the pad region of the panel substrate 100 and the output wire region 220 of the COF 200 may be prevented.

As described above, the output wires in the output wire region 220 are formed so that the pitch between the output wires of the first section 221 arranged in the center region of the output wire region 220 of the COF 200 is constant, while the output wires are formed without having an angle. Further, the output wires of the second and third sections 222 and 223 are formed to have a gradually increasing pitch toward a respective edge, while the output wires are angled. Accordingly, misalignment between the panel region of the panel substrate 100 and the output wires can be prevented or substantially minimized, and an electric short due to an abrupt change of pitch can be prevented from occurring.

Figure 5:
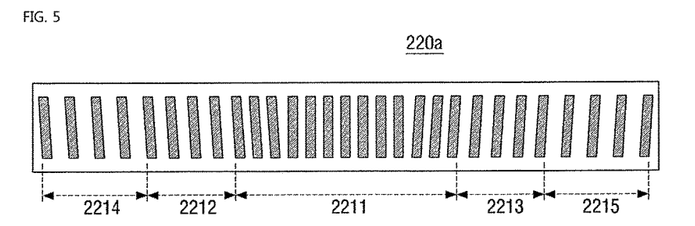
FIG. 5 illustrates a plan view of an output wire region of a COF according to another embodiment.
Figure 6:
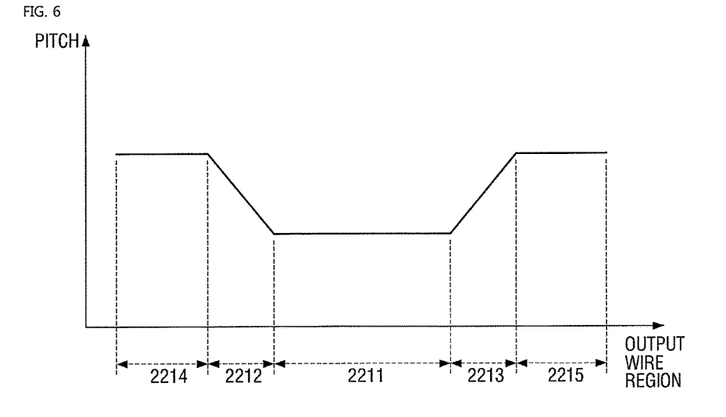
FIG. 6 illustrates a graph of the characteristic of a pitch between output wires of a COF according to another embodiment.

FIG. 5 is a plan view illustrating an output wire region of a COF according to another embodiment, and FIG. 6 is a graph illustrating the characteristic of a pitch between the output wires of the COF in FIG. 5.

Referring to FIG. 5, an output wire region 220a of the COF 200 according to another embodiment may be divided into a plurality of sections. For example, the output wire region 220a may be divided into the first section 2211, the second section 2212 arranged on the first side of the first section 2211, the third section 2213 arranged on the second side of the first section 2211, a fourth section arranged adjacent to the second section 2212, and a fifth section 2215 arranged adjacent to the third section 2213.

As described above, the first section 2211 may correspond to the center region in the output wire region 220a of the COF 200, and as illustrated in FIG. 6, the interval between the output wires arranged in the first section 2211 may have a fixed pitch, e.g., about 26.0 µm. Further, the plurality of output wires that are formed in the first section 2211 may not have an angle, but may be arranged in the form of a straight line.

The second section 2212 and the third section 2213 may include a plurality of output wires, and as illustrated in FIG. 6, the pitches between the output wires that are arranged in the second section 2212 and the third section 2213 may be arranged to be gradually increasing toward respective edge regions. For example, if the output wires of the first section 2211 have a pitch of 26.0 µm, the interval between the wire of the outermost edge of the first section 2211 and the first wire of the second section 2212 and the third section 2213 may have a pitch of 26.2 µm, and the interval between the first wire and the second wire of the second section 2212 and the third section 2213 may have a pitch of 26.4 µm. Here, the first wire of the first and second wires of the second section 2212 and the third section 2213 may be arranged at a distance that is close to the first section 2211. Further, the plurality of output wires that are arranged in the second section 2212 and the third section 2213 may have an angle. If the output wires are formed to have an angle as described above, misalignment between the pad region of the panel substrate 100 and the output wire region 220a of the COF 200 can be prevented from occurring.

Further, the fourth section 2214 and the fifth section 2215 may be arranged adjacent to the second section 2212 and the third section 2213, respectively. In other words, the fourth section 2214 and the fifth section 2215 may be arranged at outermost regions on the left side and the right side, respectively, of the output wire region 220a of the COF 200. As illustrated in FIG. 6, the interval between the output wires arranged in the fourth section 2214 and the fifth section 2215 has a fixed pitch. For example, if the pitch between the output wires of the second section 2212 and the third section 2213 is increased by 0.2 µm from 26.2 µm toward the edge, and the pitch between the last output wires of the edge is of 27 µm, the pitch between the output wires of the fourth section 2214 and the fifth section 2215 may be fixed at 27.5 µm. Further, the plurality of output wires arranged in the fourth section 2214 and the fifth section 2215 may have the same angle as the angle of the output wires arranged in the second section 2212 and the third section 2213.

Further, while according to FIGS. 5-6 the output wire region 220a of the COF 200 is divided into five sections, embodiments are not limited thereto. For example, the output wire region may be further sub-divided, and regions having a fixed pitch between the output wires and regions having different pitches may be alternately arranged.

Figure 7:
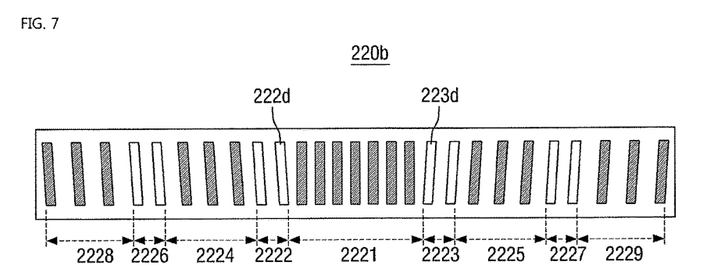
FIG. 7 illustrates a plan view of an output wire region of a COF according to still another embodiment.

FIG. 7 is a plan view illustrating an output wire region of a COF according to still another embodiment.

Referring to FIG. 7, an output wire region 220b of the COF 200 according to still another embodiment may be divided into a plurality of sections. For example, the output wire region 220b may be divided into first to ninth sections 2221 to 2229. For example, as illustrated in FIG. 7, the first section 2221 may be between the second and third sections 2222 and 2223, the second section 2222 may be between the first and fourth sections 2221 and 2224, the sixth section 2226 may be between the fourth and eighth section 2224 and 2228, etc.

As described above, the first section 2221 may correspond to the center region in the output wire region 220b of the COF 200, and as illustrated in FIG. 7, the interval between the output wires arranged in the first section 2221 may have a fixed pitch, e.g., 26 µm. Further, the plurality of output wires 221b that are formed in the first section 2221 may not have an angle, but may be arranged in the form of a straight line.

Second section 2222 and the third section 2223 are sections formed on the first and second sides of the first section 2221, respectively, and dummy output wires 222d and 223d may be arranged therein (white wires in FIG. 7). For example, the second and third sections 2222 and 2223 may include only the dummy output wires 222d and 223d therein. The dummy output wires 222d and 223d of the second section 2222 and the third section 2223 prevent an electric short that may occur as the pitch between the output wires is abruptly increased between the first section 2221 and the fourth section 2224 or the fifth section 2225. Accordingly, the size of the pitch between the dummy output wires 222d and 223d may have any suitable value, and the number of the dummy output wires 222d and 223d may not be limited. However, the number of dummy output wires should be designed in consideration of a total length of the COF 200. The dummy output wires 222d and 223d may have an angle to prevent a misalignment, but are not limited thereto. The dummy output wires that are close to the center region may not have an angle.

The fourth section 2224 and the fifth section 2225 are sections that are formed adjacent to the second section 2222 and the third section 2223, respectively, and a plurality of output wires may be arranged therein. The interval between the output wires of the fourth section 2224 and the fifth section 2225 may have a fixed pitch. However, the interval between the output wires of the fourth section 2224 and the fifth section 2225 may have a wider pitch than the pitch of the interval between the output wires arranged in the first section 2221. For example, if the output wires of the first section 2221 have a pitch of 26 µm, the output wires of the fourth section 2224 and the fifth section 2225 may have a pitch of 28 µm. The output wires of the fourth section 2224 and the fifth section 2225 arranged as described above may be arranged to have an angle.

The sixth section 2226 and the seventh section 2227 are sections that are formed adjacent to the fourth section 2224 and the fifth section 2225, respectively, and dummy output wires, which are arranged in the second section 2222 and the third section 2223, may be arranged therein. Since explanation of the sixth section 2226 and the seventh section 2227 is the same as the explanation of the second section 2222 and the third section 2223 above, a duplicate description thereof will be omitted.

The eighth section 2228 and the ninth section 2229 are sections that are formed adjacent to the sixth section 2226 and the seventh section 2227, respectively, and a plurality of output wires may be arranged therein. The interval between the output wires of the eighth section 2228 and the ninth section 2229 may have a fixed pitch. However, the interval between the output wires arranged in the eighth section 2228 and the ninth section 2229 may have a wider pitch than the pitch of the output wires of the fourth section 2224 and the fifth section 2225. For example, if the output wires arranged in the fourth section 2224 and the fifth section 2225 have a pitch of 28 µm, the output wires arranged in the eighth section 2228 and the ninth section 2229 may have a pitch of 30 µm. The output wires arranged in the eighth section 2228 and the ninth section 2229 may also be arranged to have an angle.

Figure 8:
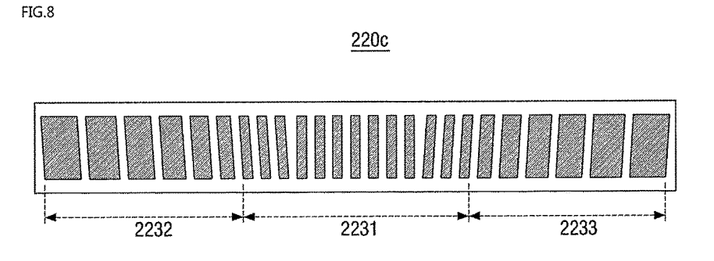
FIG. 8 illustrates a plan view of an output wire region of a COF according to yet still another embodiment.

FIG. 8 is a plan view illustrating an output wire region of a COF according to yet still another embodiment.

Referring to FIG. 8, an output wire region 220c of the COF 200 according to yet still another embodiment may be divided into a plurality of sections. For example, the output wire region 220c may include the first section 2231, a second section 2232 arranged on a first side of the first section 2231, and a third section 2233 arranged on a second side of the first section 2231.

The first section 2231 may correspond to a center region in the output wire region 220c of the COF 200. The first section 2231 may include a plurality of output wires, an interval between the output wires may have a fixed pitch, and the width of the output wires may also be fixed. The plurality of output wires formed in the first section 2231 may not have an angle, but may be arranged in the form of a straight line.

The second section 2232 and the third section 2233 may include a plurality of output wires with a fixed pitch. Further, the output wires may be arranged to have a different line width. In other words, the line width of the output wires that are arranged in the second section 2232 and the third section 2233 may be gradually increased toward an edge of the output wire region 220c. For example, if the line width of the output wires of the first section 2231 is 10 µm, the line width of the output wires of the second section 2232 and the third section 2233 may be gradually increased to be, e.g., 10.2 µm, 10.4 µm, 10.6 µm, and so on. Further, the plurality of output wires that are arranged in the second section 2232 and the third section 2233 may have an angle. If the output wires are formed to have an angle as described above, it becomes easy to match the alignment with the pad region that is formed on the panel substrate 100. In other words, misalignment between the pad region of the panel substrate 100 and the output wire region 220c of the COF 200 may be prevented or substantially minimized.

By way of summation and review, a driver IC in a flexible display may be mounted on a COF film, which can be bent toward a rear surface of a display region to arrange the driver IC with a compact structure, and may be connected with a plurality of conventional wires to a plurality of pads on the rear surface. However, since the plurality of conventional wires connected to the driver IC is arranged with a uniform pitch therebetween, a part of the COF film expands due to thermal compression when the driver IC is attached to a non-display region of the display panel, thereby causing misalignment between the plurality of pads on the display panel and the wires on the heat-expanded COF. If misalignment occurs, an electric short may occur between the pads and the wires on the COF, thereby lowering reliability of the flexible display device.

Therefore, according to embodiments, a display device includes a plurality of wires on a COF that are divided into a plurality of sections. The plurality of sections include non-uniform pitches between the wires therein in accordance with directions in which the wires are formed. As such, misalignment is prevented or substantially minimized, while reliability of the flexible display device is increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display device, comprising:
a panel substrate including a pad region; and
a COF (Chip On Film) including a wire region, the wire region including a plurality of wires spaced apart in a first direction and connected to the pad region of the panel substrate, wherein:
the plurality of wires in the wire region is arranged into a plurality of sections, the plurality of sections including a first section having a plurality of wires in a center region of the COF, a second section having a plurality of wires at a first side of the first section, a third section having a plurality of wires at a second side of the first section, a fourth section adjacent to the second section, the second section being between the first and fourth sections, and a fifth section adjacent to the third section, the third section being between the first and fifth sections,
wires within the first section are arranged at a first pitch, the wires within the second and third sections are arranged at a second pitch, the second pitch being greater than the first pitch, the wires within the second and third sections are oriented at an angle relative to wires within the first section, the first pitch of the wires within the first section is a constant pitch in the first section, the second pitch of the wires in the second and third sections increases within the second and third sections such that the wires in the second and third sections are increasingly spaced apart toward respective outer edges of the COF, and the wires in the fourth and fifth sections are disposed at a third pitch, the third pitch being a constant pitch in the fourth and fifth sections, the third pitch being greater than the first pitch.

2. The display device as claimed in claim 1, wherein the wires in the first section are perpendicular to the first direction.

3. The display device as claimed in claim 1, further comprising dummy wires in the second section and in the third section.

4. A display device, comprising:
a panel substrate including a pad region; and
a COF (Chip On Film) including a wire region, the wire region including a plurality of wires spaced apart in a first direction and connected to the pad region of the panel substrate, wherein:
the plurality of wires in the wire region is arranged into a plurality of sections, the plurality of sections including a first section having a plurality of wires in a center region of the COF, a second section having a plurality of wires at a first side of the first section, and a third section having a plurality of wires at a second side of the first section,
line widths within the first section are different from line widths within the second and third sections, the first section including a plurality of wires with a same line width,
the wires within the second and third sections are oriented at an angle relative to wires within the first section, and
the wires in the second section are at an opposite angle with respect to the wires in the third section.

5. The display device as claimed in claim 4, wherein the line width of the wires in the first section is narrower than the line width of the wires in the second and third sections.

6. The display device as claimed in claim 5, wherein line widths of the wires in the second and third sections gradually increase, as a distance of the wires from the center region of the COF increases.

7. The display device as claimed in claim 4, wherein the wires in the first section are perpendicular to the first direction.

8. A display device, comprising:
a panel substrate including a pad region; and
a COF (Chip On Film) including a wire region, the wire region including a plurality of wires spaced apart in a first direction and connected to the pad region of the panel substrate, wherein:
the plurality of wires in the wire region is arranged into a plurality of sections, the plurality of sections including a first section having a plurality of wires in a center region of the COF, a second section having a plurality of wires at a first side of the first section, and a third section having a plurality of wires at a second side of the first section,
the wires within the first section are arranged at a first pitch,
the wires within the second and third sections are arranged at a second pitch, the second pitch being greater than the first pitch,
the wires within the second and third sections are oriented at an angle relative to wires within the first section, and
the wires in the second section are at an opposite angle with respect to the wires in the third section.

9. The display device as claimed in claim 1, wherein the angle is greater than 0 degrees and less than 90 degrees.

10. The display device as claimed in claim 1, wherein the wire region is directly over the pad region, the plurality of wires being in contact with pads in the pad region.

11. The display device as claimed in claim 4, wherein the angle is greater than 0 degrees and less than 90 degrees.

12. The display device as claimed in claim 4, wherein the wire region is directly over the pad region, the plurality of wires being in contact with pads in the pad region.

* * * * *